(12) United States Patent
Falk

(10) Patent No.: US 7,952,374 B2
(45) Date of Patent: May 31, 2011

(54) TRANSIENT EMISSION SCANNING MICROSCOPY

(75) Inventor: R. Aaron Falk, Newcastle, WA (US)

(73) Assignee: Quantum Focus Instruments Corporation, Vista, CA (US)

(*) Notice: Subject to any disclaimer, the term of this patent is extended or adjusted under 35 U.S.C. 154(b) by 0 days.

(21) Appl. No.: 12/477,082

(22) Filed: Jun. 2, 2009

(65) Prior Publication Data

US 2009/0295414 A1 Dec. 3, 2009

Related U.S. Application Data

(60) Provisional application No. 61/058,171, filed on Jun. 2, 2008.

(51) Int. Cl.
*G01R 31/308* (2006.01)
(52) U.S. Cl. .................................. 324/754.23
(58) Field of Classification Search .......... None
See application file for complete search history.

(56) References Cited

U.S. PATENT DOCUMENTS

| 5,537,247 | A | * | 7/1996 | Xiao | 359/368 |
| 5,940,545 | A | | 8/1999 | Kash et al. | |
| 6,608,494 | B1 | * | 8/2003 | Bruce et al. | 324/752 |
| 7,355,701 | B2 | * | 4/2008 | Ishibashi | 356/300 |

* cited by examiner

*Primary Examiner* — Roberto Velez
(74) *Attorney, Agent, or Firm* — Black Lowe & Graham PLLC

(57) ABSTRACT

An apparatus for analyzing an integrated circuit to which one or more test signals are applied. An example apparatus includes an objective lens that views reflections from the integrated circuit, a device that houses at least two optical fibers, a component that receives reflections from the objective lens and directs the received reflections to the device, and a photo-diode that receives a reflection received by the device. The apparatus includes a beam splitter that directs reflections from the integrated circuit to a detector. A processing device generates an image signal based on a signal received from the detector and a display outputs an image based on the image signal. The component includes a scan mirror that reflects the collimated reflections to a collimating lens that focuses the reflections from the scan mirror toward the device.

10 Claims, 5 Drawing Sheets

TRANSIENT EMISSION SCANNING MICROSCOPY

PRIORITY CLAIM

This application claims the benefit of U.S. Provisional Application Ser. No. 61/058,171 filed Jun. 2, 2008, the contents of which are hereby incorporated by reference.

FIELD OF THE INVENTION

This invention is directed towards detection of transient emissions from semiconductor devices.

BACKGROUND OF THE INVENTION

U.S. Pat. No. 5,940,545 by Kash and Tsang describes the use of photon timing detection to determine the switching time of transistors in a semiconductor integrated circuit. Kash et al. describe how typical digital circuits will only emit photons during the switching transient. These photons are detected and the arrival time is recorded. Two techniques are described. Both techniques utilize a time-to-amplitude converter and a multi-channel analyzer to determine the photon arrival time and sort the collected data into a time histogram. The first technique utilizes a single avalanche photodiode with a fiber optic probe placed over the sampling area as the photon detection arrangement. The second utilizes a micro-channel plate array detector with standard microscope optics as the photon detection arrangement. In addition, the second technique utilizes position detection electronics to determine the transverse (XY) location of the detected photon. Kash et al. also describe placing the avalanche photodiode at the position of the micro-channel plate in the microscope arrangement to act as a single point detector.

U.S. Pat. No. 6,608,494 by Bruce et al. describes an improvement on Kash et al. with the addition of an 'aperture element' 208, and otherwise appears to be identical. The use of apertures in optical systems has been widely known for some time. Bruce et al. indicate the potential use of a scanning laser microscope in their arrangement, but do not explicitly indicate how such a system would be configured (column 3, lines 54-58). Specifically, the issue of how to co-align the laser imaging portion of the microscope with the photon-emission portion of the microscope needed to point at the target is not addressed.

Both the above inventions require a separate means of imaging the integrated circuit in order to determine the actual physical location on the circuit that corresponds to the detected emission photons. That is to say an array camera (e.g. a CCD) or some other imaging means is needed to supply navigation to the area of interest and to determine the photon emission location. Although not explicitly indicated, both inventions require some mechanical means to point the detector at the area of interest on the integrated circuit into the detection field of view. For a single point detector and the scale size of current integrated circuits; expensive, high-precision mechanical stages with sub-micron positioning accuracy are required to achieve the required pointing.

It is the purpose of the current invention to eliminate the need for:

An aperture in the image plane that requires placement over the detection area;

An independent imaging system for navigation and pointing; and

The requirement for high-precision mechanical translation stages.

It is the further purpose of the current invention to allow multiple detection paths that can be conveniently co-aligned and pointed at a target.

SUMMARY OF THE INVENTION

The present invention provides an apparatus for analyzing an integrated circuit to which one or more test signals are applied. An example apparatus includes an objective lens that views reflections from the integrated circuit, a device that houses at least two optical fibers, a component that receives reflections from the objective lens and directs the received reflections to different ones of the at least two optical fibers, and a photo-diode that receives a reflection received by one of at least two optical fibers and adapted to detect a photoemission from the integrated circuit.

In one aspect of the present invention, the apparatus includes a beam splitter that directs reflections from the integrated circuit to a detector. Also included is a second component that applies one or more test signals to the integrated circuit, a processing device that generates an image signal based on a signal received from the detector, and a display that outputs an image based on the image signal.

In another aspect of the present invention, the component includes a first collimating lens that collimates reflections from the objective lens, a scan mirror that reflects the collimated reflections, a second collimating lens that focuses the reflections from the scan mirror toward the device, and a scan mirror controller that controls position of the scan mirror for progressing through reflections in a predefined pattern.

BRIEF DESCRIPTION OF THE DRAWINGS

Preferred and alternative examples of the present invention are described in detail below with reference to the following drawings.

DETAILED DESCRIPTION OF THE PREFERRED EMBODIMENT

Figure 1:
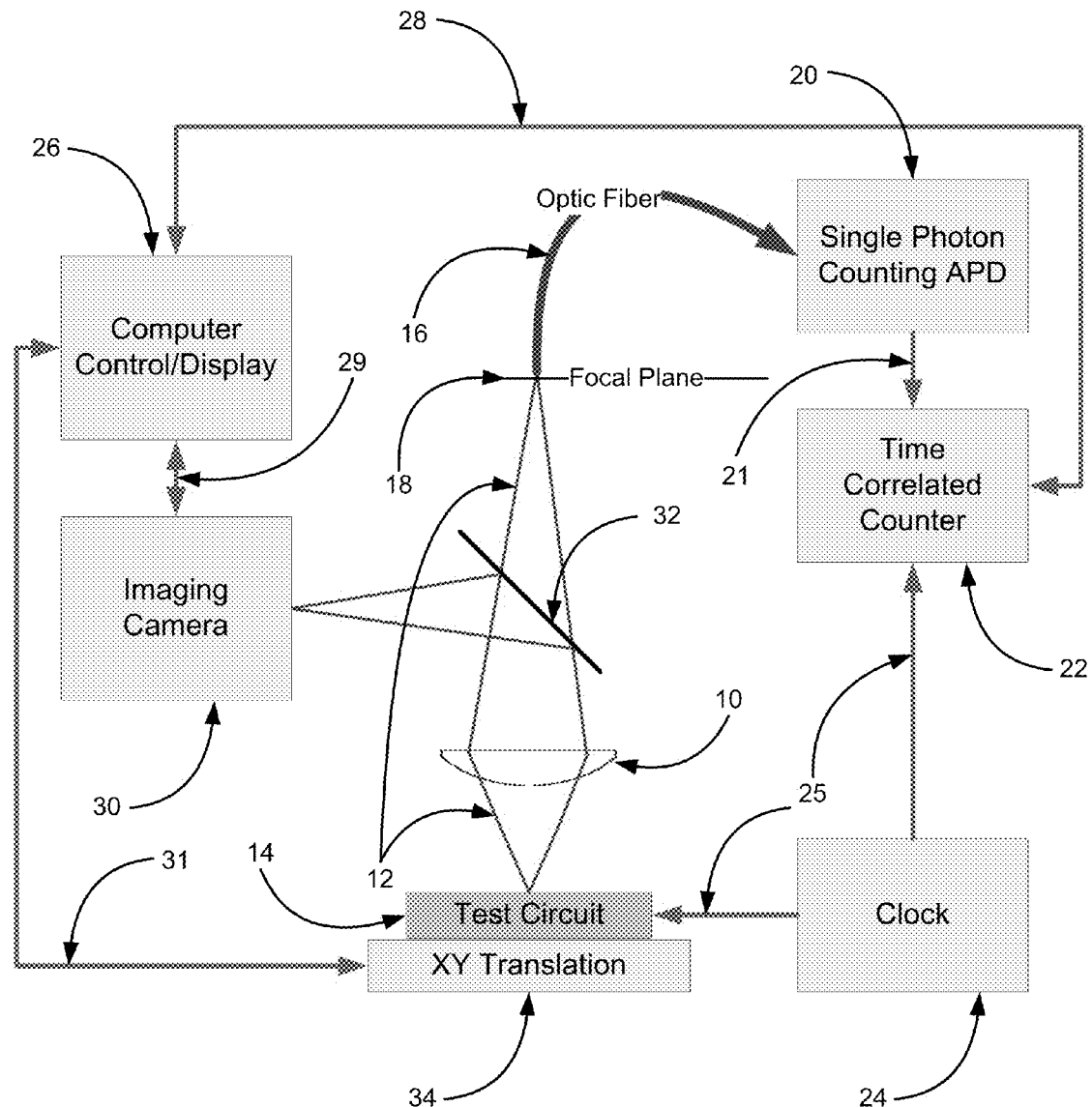
FIGS. 1 and 2 show single-point transient-emission detection systems formed in accordance with the prior art.

The prior art is first described in order to better clarify the differences with the current invention. FIG. 1 shows the basic components of a single-point transient-emission detection system as described in the first configuration of U.S. Pat. No. 5,940,545 and in U.S. Pat. No. 6,608,494. A microscope objective 10 focuses optical emission 12 from a test circuit 14 onto the end of an optical fiber 16 at the objective focal plane 18. The optical fiber 16 couples into a single photon counting detector 20 (e.g. an Avalanche Photodiode (APD)). Although the detector 20 could be placed directly into the focal plane 18, the use of an optical fiber 16 as fiber coupling adds flexibility to the design. Photons arriving at the detector 20 create an electrical pulse which is electrically connected 21 to a time correlated counter 22. The time correlated counter 22 records the pulse arrival time. The collection of several pulses allows the counter 22 to produce a histogram of the arrival time of the collected photons during the collection sampling period. The counter 22 would typically consist of a time-to-amplitude converter followed by a fast analog-to-digital converter, followed by a multi-channel analyzer as sub-components (not explicitly shown). A clock 24 is used to set the relative timing between the test circuit 14 and the time correlated counter 22 via electrical connections 25. A computer 26 would typically be used to set system control values and accept data via electrical lines 28. Typically the computer 26 would also be used to display the histogram.

Means are needed to point the image of the optical fiber 16 end point at the desired spot on the test circuit 14. The prior art suggests use of a separate imaging camera 30 with electrical connection 29 to the computer 30 for display of an image of the test circuit 14. A fold mirror 32 or similar technique can be used to direct the optical path 12 towards the camera 30. Some form of illumination (not shown) would also be required. U.S. Pat. No. 6,608,494 suggests that a scanning laser imaging device could be used as the imaging camera 30. Implicit in the prior art is the need to for a XY translation of the test circuit 14 (or equivalently the entire optical path can be translated) in order to point the image of the fiber 16 end point at the desired spot on the test circuit 14. FIG. 1 explicitly includes an XY translation component 34 connected to the computer 26 via an electrical line 31 for performing position control. In addition, some means to optically co-align the camera 30 and the fiber 16 end point is also required.

Figure 2:
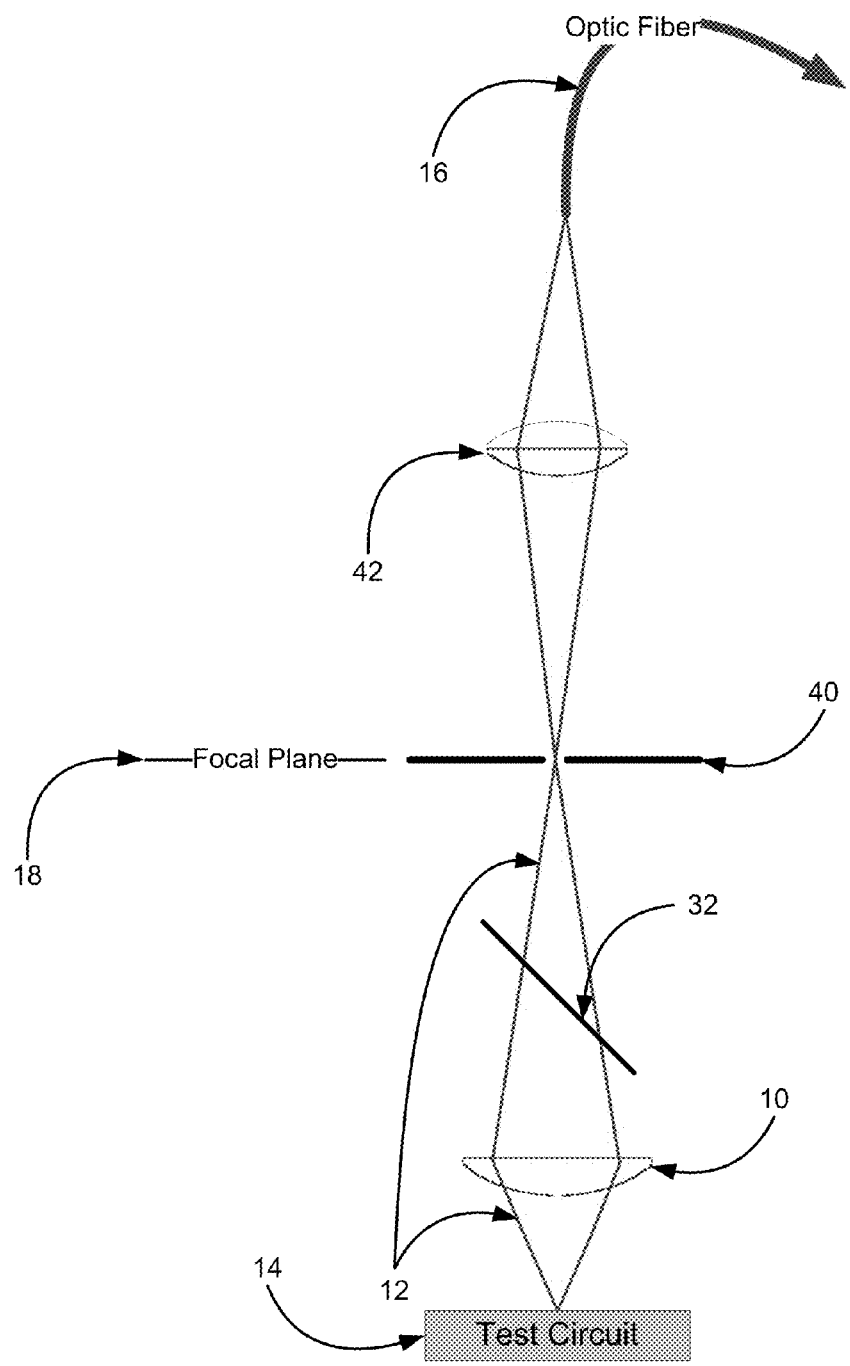

U.S. Pat. No. 6,608,494 is equivalent to U.S. Pat. No. 5,940,545 except for a few additional optical components as shown in FIG. 2 (non-optical components of FIG. 1 are suppressed for clarity). The additional components include a variable shutter 40 placed in the focal plane 18 and a relay lens 42. The relay lens 42 images the variable shutter 40 aperture onto the end of optical fiber 16. When the image of the variable shutter 40 aperture is smaller than the aperture of the optical fiber 16, the image becomes the limiting aperture of the optical system. A variable limiting aperture is thereby obtained.

Figure 3:
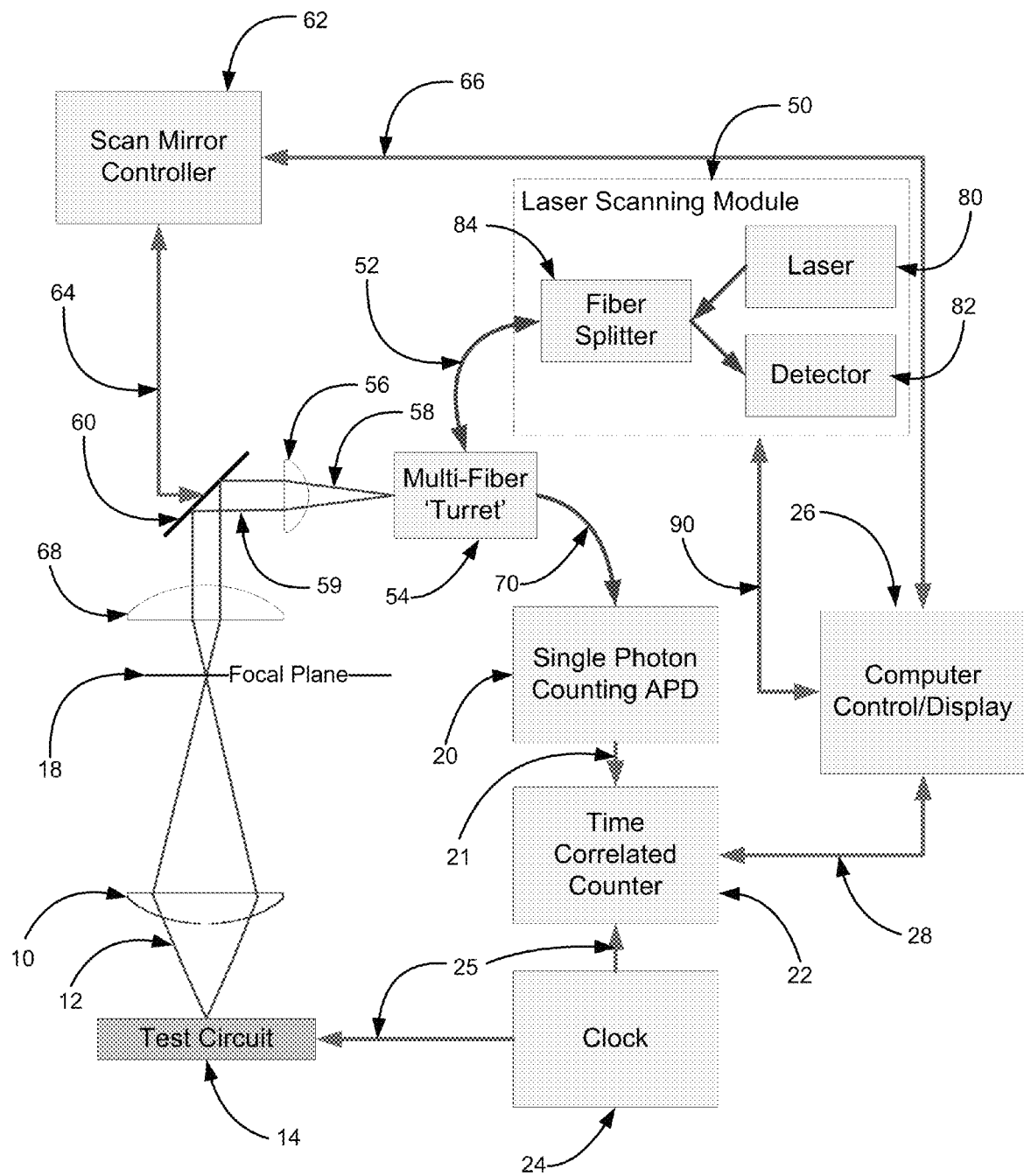
FIG. 3 illustrates a system formed in accordance with the present invention.

As shown in FIG. 3, the present invention includes
Microscope objective 10
Optical emission 12
Test circuit 14
Objective focal plane 18
Single photon counting detector 20
Electrical connected 21
Time correlated counter 22
Clock 24
Electrical connections 25
Computer 26
Electrical connection 28.

These components are similar to those shown in FIG. 1. Although (as will be described in more detail below) it is understood that the software control and acquisition of the computer 26 are not identical.

The difference between the current invention and the prior art, as illustrated in FIG. 3, is the direct integration of the above components into a laser scanning microscope. In the prior art, the scanning laser is a secondary add on for imaging purpose only. That is to say the laser scanning microscope can be removed and replaced with any imaging system. The current invention fully merges these two components. As will be described, direct integration produces several functional improvements.

There are many forms of laser scanning microscopes, the one shown in FIG. 3 being a standard configuration. In this embodiment a laser scanning module 50 is optically coupled to a first optical fiber 52. The laser scanning module 50 includes a fiber splitter 84 that directs light from a laser 80 to the first optical fiber 52 and from the first optical fiber 52 to a detector 82. The detector 82 transforms the received light into an electrical signal that is sent to the computer 26 via an electrical connection 90. The computer 90 digitizes the electrical signal and creates an image for display.

The first optical fiber 52 is coupled into a multi-fiber turret 54 (described in more detail later) which places the end of the first optical fiber 52 at the focus of a collimating lens 56. The collimating lens 56 collimates a divergent light beam 58 from the end of the first optical fiber 52 into a collimated light beam 59 and directs the beam 59 towards a scanning mirror(s) 60. The scan mirror(s) 60 is rotated in the both the X and Y planes (perpendicular to the optical axis) as controlled by a scan mirror controller 62 through an electrical connection 64 to an actuator (not shown). The scan mirror controller 62 is further connected via an electrical connection 66 to the computer 26. The computer 26 coordinates the scan motion (typically a raster scan) with data acquisition from the detector 82 so as to form an image. Typically two scan mirrors are used to produce X and Y scanning, however, single mirror arrangements are also utilized.

A tube lens 68 focuses the scanned light onto the microscope focal plane 18. The tube lens 68 also transforms the angular motion of the scan mirror(s) into a positional motion in the focal plane 18. The light from the tube lens 68 then couples through the microscope objective 10 in the usual manner. Light reflected from the test circuit 14 is coupled back into the end of first optical fiber 52 via optical reciprocity, where it is directed towards the detector 82 by the fiber splitter 84. The detected intensity versus scan position is used (typically by the computer 26) to produce a laser scanning microscope image of the test circuit 14.

A second optical fiber 70 is attached to the multi-fiber turret 54 such that the end of the second optical fiber 70 is also at a focus (i.e. in the focal plane) of the collimating lens 56. The second optical fiber 70 serves the same purpose as the optical fiber 16 in FIG. 1, that is to say it couples the optical emission 12 from the test circuit 14 into the single photon counting detector 20. This coupling integrates the photo timing components directly into the laser scanning microscope.

Figure 4A:
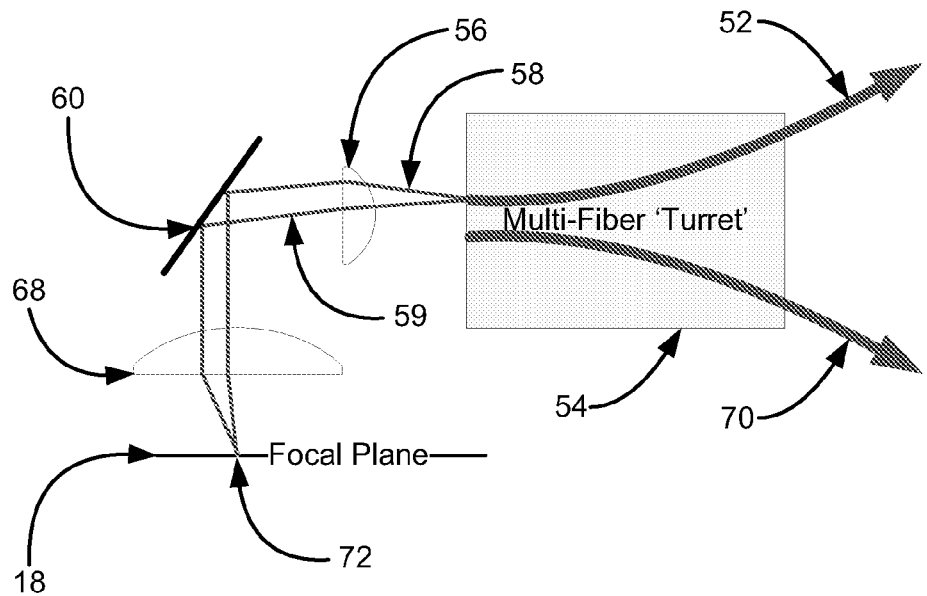
FIGS. 4A, B show image steering performed by the present invention.
Figure 4B:
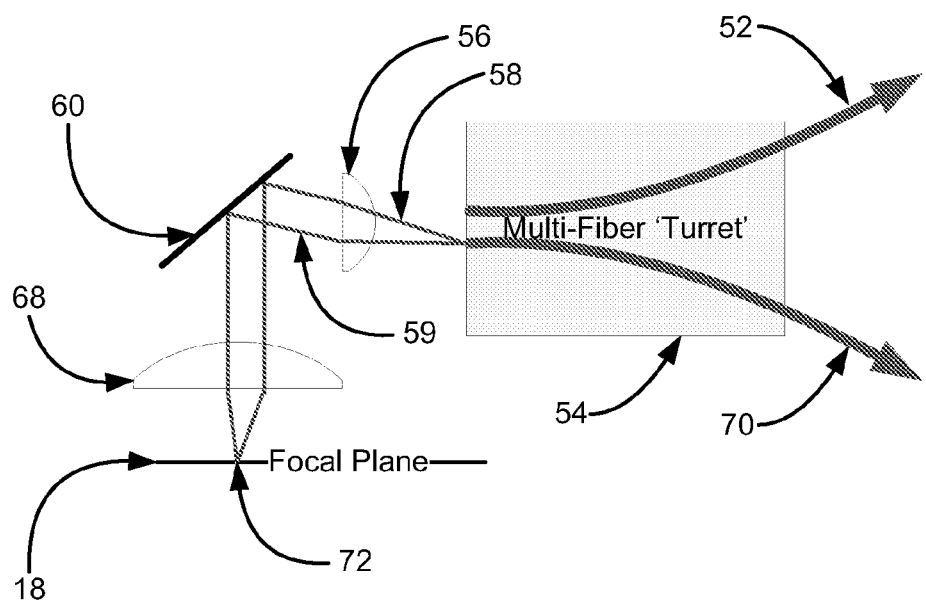

This arrangement of the first optical fiber 52 and the second optical fiber 70 within the multi-fiber turret 54 is shown in more detail in FIG. 4. Displacement in the XY plane (perpendicular to the optical axis) of the end of either the first or second optical fibers 52, 70 produces an angular shift in the collimated light beam 59 formed by the collimator 56. This shift is shown in exaggerated form (typical shifts are less than 1 degree) in FIGS. 4A and B. As shown in FIG. 4A, an upward displacement (along Y-axis) of the first optical fiber 52 from the optical axis causes a downward angle in the collimated light beam 59. FIG. 4B shows that a downward displacement (along Y-axis) of the second optical fiber 68 from the optical axis causes the collimator 64 to make the collimated light beam 59 have an upward angle.

Figures 5A, 5B, 5C:
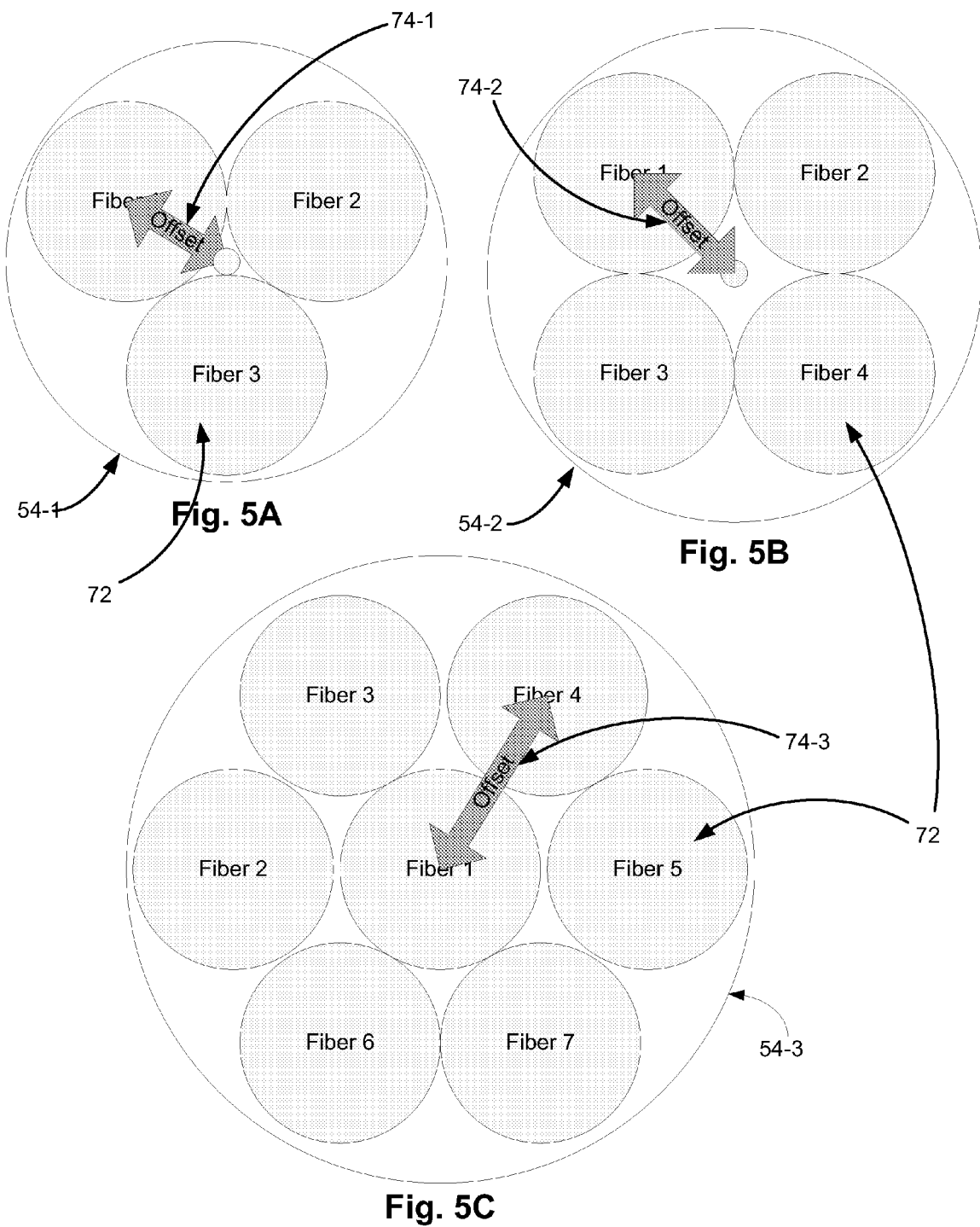
FIGS. 5A-C illustrate end views of exemplary turrets.

These angular shifts can be compensated via a rotation of the scan mirror(s) 60 as shown in FIGS. 4A and B so that the optical beams return to parallel with the optical axis. In both cases a focus spot 72 in the focal plane 18 is returned to the on-axis (central) position via rotation of the scan mirrors(s) 60. There is no other affect to the optical system. The current invention takes advantage of this optical invariance to place multiple fibers into the multi-fiber turret 54 with their end points located in the focal plane of the collimating lens. The end faces of the multi-fiber turrets 54-1 thru 54-3 are shown in FIGS. 5A-C. The end face includes a bundle of multiple fibers 72. Cases of three FIG. 5A, four FIG. 5B and seven FIG. 5C fibers 72 being shown in a close packing arrangement. An offset 74-1 thru 74-3 from the center of each bundle for the fibers is fixed by the fiber diameter. Typical fibers are 125 micron in diameter, so this offset is small, less than or equal to the fiber diameter for the configurations in FIG. 3. The angular shift produced by the offset is related to the fiber offset via the collimator focal length, f, is as follows:

Angular shift=$f$*fiber offset

Since the fiber offset is fixed via the fiber diameter and the collimator focal length is known, the angular shift between fibers 72 within the multi-fiber turret 54 is known and readily compensated by fixed offsets in the scanning mirror(s) 60. If needed, further calibration can be made by coupling the laser scanner module 50 into each of the fibers in the turret and recording the offset in the resultant image.

In operation, the laser scanning module 50 attached to the first optical fiber 52 in the multi-fiber turret 54 is turned on and used to produce an image of the test circuit 14. The desired position on the test circuit 14 is then located on the image. The scan mirror(s) 50 is then rotated using an actuator (not shown) to point the end of the second optical fiber 70 at the desired position on the test circuit 14 using the known offset between the two fibers 52 and 70. The laser scanning module 50 is then turned off and the emissions 12 are collected into the second optical fiber 70 and detected as described earlier. Note that an XY translation stage (item 34 in FIG. 1) is no longer required for pointing a fiber.

Note that additional fibers in the multi-fiber turret 54 can be used to couple in other detection technologies or allow different types of fibers (single and multi-mode) to be used for a single detection. Specifically, use of fibers with differing core diameters produces a different limiting apertures, eliminating the need for the variable shutter 40.

Note that the described optical arrangement would typically also include the use of field lenses between the ends of the fibers 72 and the collimating lens 56 to reduce vignetting effects. These lenses are not shown as they should be obvious to any optics designer, have no direct impact on the present invention and would tend to obscure the description. That is to say these additional lenses are desirable, but not required.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

The embodiments of the invention in which an exclusive property or privilege is claimed are defined as follows:

1. An apparatus for analyzing an integrated circuit to which one or more test signals are applied, the apparatus comprising:
   an objective lens arranged to view reflections from the integrated circuit;
   a device configured to house at least two optical fibers;
   a single component not housed within the device, the single component configured to receive reflections from the objective lens and to direct the received reflections to different ones of the at least two optical fibers; and
   a photo-diode configured to receive a reflection received by one of the at least two optical fibers and adapted to detect a photoemission from the integrated circuit.

2. The apparatus of claim 1, wherein the photo-diode is an avalanche photo-diode.

3. The apparatus of claim 1, further comprising a timer circuit communicatively coupled to the photo-diode and to the integrated circuit, the timer circuit configured to provide an output signal indicative of time expired between occurrence of a signal from the integrated circuit and a signal from the photo-diode.

4. The apparatus of claim 3, further comprising a computer coupled to the timer circuit, and configured and arranged to record the output signal.

5. The apparatus of claim 1, further comprising a beam splitter configured to direct reflections from the integrated circuit to a detector.

6. The apparatus of claim 5, further comprising:
   a second component configured to apply one or more test signals to the integrated circuit;
   a processing device configured to generate an image signal based on a signal received from the detector; and
   a display configured to output an image based on the image signal.

7. The apparatus of claim 1, wherein the component comprises:
   a first collimating lens configured to collimate reflections from the objective lens;
   a scan mirror configured to reflect the collimated reflections;
   a second collimating lens configured to focus the reflections from the scan mirror toward the device configured to house at least two optical fibers; and
   a scan mirror controller configured to control position of the scan mirror for progressing through reflections in a predefined pattern.

8. The apparatus of claim 7, wherein position of the mirror is controllable.

9. The apparatus of claim 8, wherein the predefined pattern is a raster scan pattern.

10. The apparatus of claim 1, further comprising a laser for generating light used to cause the reflections from the integrated circuit.

* * * * *